(12) United States Patent
Yuki et al.

(10) Patent No.: US 7,641,530 B2
(45) Date of Patent: Jan. 5, 2010

(54) METHOD OF FORMING AN ORGANIC EL PANEL

(75) Inventors: Toshinao Yuki, Yamagata-ken (JP);
Kunihiko Shirahata, Yamagata-ken (JP)

(73) Assignee: Tohoku Pioneer Corporation, Yamagata-ken (JP)

( * ) Notice: Subject to any disclaimer, the term of this patent is extended or adjusted under 35 U.S.C. 154(b) by 673 days.

(21) Appl. No.: 11/167,120

(22) Filed: Jun. 28, 2005

(65) Prior Publication Data

US 2005/0285514 A1    Dec. 29, 2005

(30) Foreign Application Priority Data

Jun. 29, 2004    (JP)   ............... 2004-191198

(51) Int. Cl.
*H01J 9/00* (2006.01)
*H01J 9/12* (2006.01)

(52) U.S. Cl. ............... 445/24; 445/49; 313/504; 216/101

(58) Field of Classification Search ............... 445/24, 445/46, 49, 59; 313/498–512; 216/101
See application file for complete search history.

(56) References Cited

U.S. PATENT DOCUMENTS

2002/0014470 A1*   2/2002   Okada et al. ............... 216/24
2004/0151944 A1*   8/2004   Onikubo et al. ............... 428/690
2004/0256980 A1*   12/2004   Tsuchiya ............... 313/503
2005/0077820 A1*   4/2005   Onishi et al. ............... 313/506

FOREIGN PATENT DOCUMENTS

| JP | 09-245965 | 9/1997 |
| JP | 2001-118440 A | 4/2001 |
| JP | 2001-176600 A | 6/2001 |
| JP | 2003-123987 A | 4/2003 |
| JP | 2003-234457 A | 8/2003 |

* cited by examiner

*Primary Examiner*—Nimeshkumar D. Patel
*Assistant Examiner*—Anne M Hines
(74) *Attorney, Agent, or Firm*—Arent Fox LLP

(57) ABSTRACT

An organic EL panel and a method of forming the same, in which a bottom electrode of an organic EL device is flattened at the surface so that organic layers deposited thereon have uniform thicknesses, thereby avoiding the occurrence of leak currents and allowing favorable luminescence characteristics. The organic EL panel has an organic EL device formed on a substrate, the device comprising the bottom electrode, the organic layers including at least an organic luminescent layer, and a top electrode. The bottom electrode has an etched surface obtained by chemically etching a polished surface of an electrode material film. The organic layers are formed on the etched surface.

5 Claims, 4 Drawing Sheets

$$\begin{cases} t_s = t_1 - t_2 - t_3 \\ t_2 + t_3 > t_{12} \end{cases}$$

METHOD OF FORMING AN ORGANIC EL PANEL

BACKGROUND OF THE INVENTION

The present invention relates to an organic electroluminescence (EL) panel and a method of forming the same.

The present application claims priority from Japanese Patent Application No. 2004-191198, the disclosure of which is incorporated herein by reference.

An organic EL panel has a display area which is constituted by a single or an array of surface-emitting elements. The surface-emitting elements are made of organic EL devices formed on a substrate. To form organic EL devices, bottom electrodes of various structures are formed on the substrate. Then, a pattern of organic layers including an organic luminescent layer is formed, and top electrodes are formed thereon.

FIG. 1 shows a sectional structure of an organic EL device for constituting a typical conventional organic EL panel. The organic EL device 10 is formed on a substrate 11, and has the layered structure that organic layers 20 including an organic luminescent layer are held between a pair of electrodes. To be more specific, an insulating film 13 is formed around a bottom electrode 12 which is formed on the substrate 11. The area on the bottom electrode 12, defined by this insulating film 13, makes a luminescent area S. In this luminescent area S, the organic layers 20 are laminated on the bottom electrode 12. A top electrode 14 is formed thereon.

Here, the organic layers 20 show an example of three-layer structure including a hole transporting layer 21, a luminescent layer 22, and an electron transporting layer 23, with the bottom electrode 12 and the top electrode 14 as an anode and a cathode, respectively. Other structures may also be used, including: one from which either one or both of the hole transporting layer 21 and the electron transporting layer 23 are omitted; one in which at least one of the foregoing layers is made of a plurality of layers; one in which a hole injection layer is formed on the anode side of the hole transporting layer 21; and one in which an electron injection layer is formed on the cathode side of the electron transporting layer 23. As for the bottom electrode 12 and the top electrode 14, the anode and the cathode may be inverted with the foregoing structure in reverse order.

In such an organic EL device for constituting an organic EL panel, a voltage is applied to across the bottom electrode 12 and the top electrode 14. Holes and electrons are thereby injected and transported into the organic layers 20 from the anode side and the cathode side, respectively, so that they are recombined for luminescence. Consequently, the organic layers 20 to be held between the bottom electrode 12 and the top electrode 14 must be deposited in uniform thicknesses. If the organic layers 20 in the luminescent area S have a locally thinner point, a leak current can occur in that point for poor luminescence.

To achieve the uniform thicknesses of the organic layers 20, it is of importance to improve the degree of flatness of the underlayer, or the bottom electrode 12. In general, when a bottom emission method for outputting light from the side of the substrate 11 is employed, the bottom electrode 12 is made of a transparent conductive film such as ITO (Indium-Tin-Oxide). The film is typically formed by sputtering deposition or electron beam (EB) deposition. Nevertheless, these depositions yield surface roughness on the order of several to several tens of nanometers, in terms of the maximum height (Rmax) of the surface roughness defined in JIS B0601. These figures have a considerable impact since the organic layers 20 are laminated in a thickness of 100 to 200 nm or so.

In view of this, a conventional technique described in Japanese Patent Application Laid-Open No. Hei 9-245965 has been proposed. This publication describes that the surface of the ITO bottom electrode formed by sputtering deposition or electron beam deposition is polished to 5 nm or less in the maximum height (Rmax) of the surface roughness defined in JIS B0601.

According to this conventional example, the surface of the bottom electrode is polished by several tens of nanometers, whereby projections on the surface can be ground off. There is a problem, however, that extremely deep pits might still remain. In particular, if foreign particles and the like adhere to the surface of the bottom electrode under deposition and cause deposition defects (pinholes) pits can remain in the areas of the deposition defects no matter how the surface is polished.

In addition, pits and projections remaining in/on the polished surface of the bottom electrode tend to form sharp edges. Another problem might thus occur since the edges accumulate electric charges and facilitate leak currents to the top electrode.

Moreover, after the bottom electrode is polished at the surface, abrasives (abrasive particles) may sometimes reside on the surface of the bottom electrode. This can produce the problem that the residual abrasives preclude the organic layers laminated thereon from having sufficient thicknesses, thereby causing leak currents.

Now, in view of outputting the light from the substrate side, the set thickness of the bottom electrode must be controlled according to the luminescence color so that the spectrum of the output light peaks at a desired wavelength. More specifically, the luminescence occurring from the organic layers 20 includes light which is reflected at the interfaces of the respective layers a plurality of times before transmitted through the transparent conductive film (bottom electrode) for emission. The organic EL device itself thus exhibits the function of an optical interference filter. Concerning the thickness of the bottom electrode, the spectrum of the output light varies due to the reflection and interference phenomena between the light which is output after reflection at the interface between the organic layers and the bottom electrode and the light which is output after reflection at the interface between the bottom electrode and the substrate. Consequently, the thickness control on the bottom electrode is an important design factor in forming an organic EL panel.

Nevertheless, when the bottom electrode is simply polished at the surface as in the conventional technique, the thickness to be ground off by the polishing can vary with the surface roughness. This makes it difficult to control the final thickness of the bottom electrode to a set value. That is, suppose that the bottom electrode is initially deposited to a thickness of ta, and the surface is polished by a known thickness of tb. Then, the final thickness of the bottom electrode can be set at ta-tb, whereas the surface does not always have the required flatness in this state. In other words, it is substantially impossible to set the polishing thickness tb to the known value when surface flatness is pursued. This means the problem that the bottom electrode cannot be finished to the desired thickness.

SUMMARY OF THE INVENTION

The present invention has been achieved to address the foregoing problems. It is thus an object of the present invention to flatten the surface of the bottom electrode so that the organic layers deposited thereon have uniform thicknesses, thereby preventing the occurrence of leak currents and achieving favorable luminescence characteristics. In particular, this object aims to remove sharp edges and residual abrasives effectively after the surface polishing of the bottom electrode, thereby eliminating the causes of leaks. Another object of the present invention is to flatten the surface of the bottom electrode while exercising thickness control to a desired thickness.

To achieve the foregoing objects, the organic EL panel and the method of forming the same according to the present invention provide at least the following configurations set forth in respective independent claims.

According to a first aspect of the invention as set forth in claim 1, an organic EL panel has at least one organic EL device formed on a substrate, the device comprising a bottom electrode, an organic layer including at least an organic luminescent layer, and a top electrode. The bottom electrode has an etched surface obtained by chemically etching a polished surface of an electrode material film formed on the substrate. The organic layer is formed on the etched surface.

According to a second aspect of the invention as set forth in claim 6, a method of forming an organic EL panel having an organic EL device formed on a substrate, the device comprising a bottom electrode, an organic layer including at least an organic luminescent layer, and a top electrode, comprises the steps of: forming an electrode material film having a set thickness on the substrate; polishing the electrode material film to form a polished surface; and chemically etching the polished surface to form the bottom electrode having a desired thickness.

BRIEF DESCRIPTION OF THE DRAWINGS

These and other objects and advantages of the present invention will become clear from the following description with reference to the accompanying drawings, wherein.

DETAILED DESCRIPTION OF THE PREFERRED EMBODIMENTS

Figure 1:
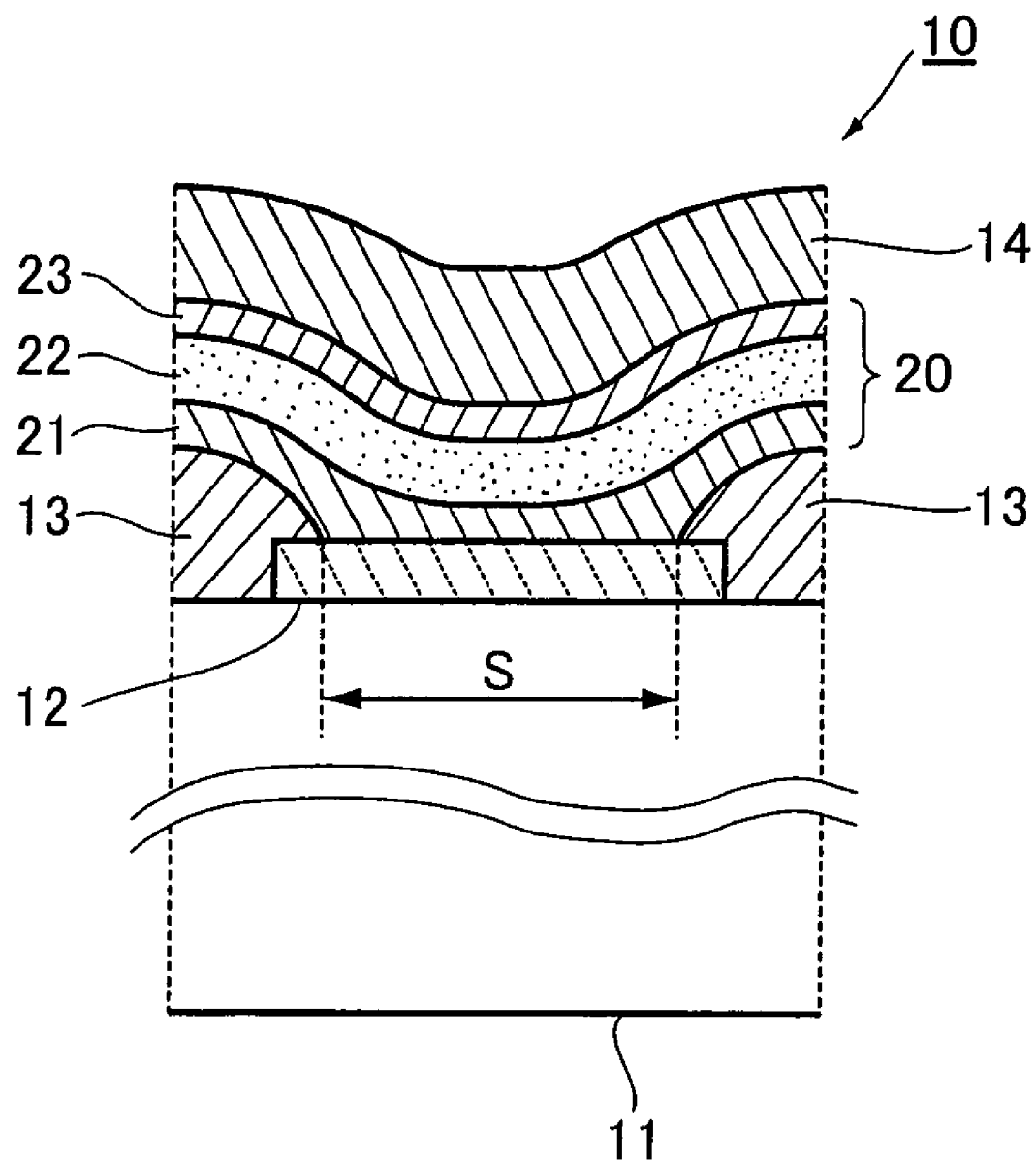
FIG. 1 is an explanatory diagram showing the basic structure of an organic EL panel according to a conventional technique and embodiments of the present invention.
Figure 2:
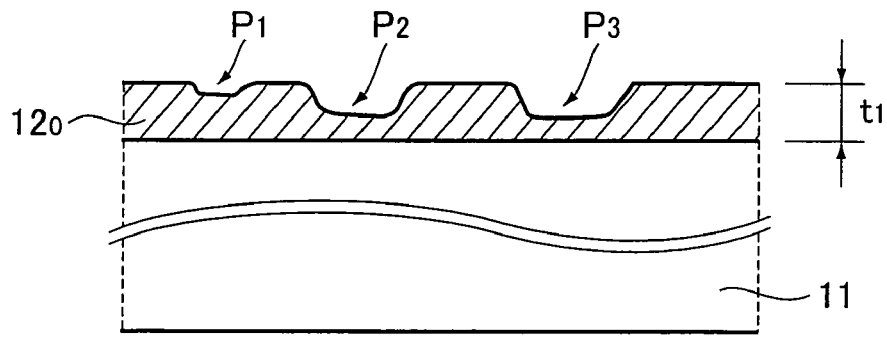
FIGS. 2A to 2C are explanatory diagrams for explaining an organic EL panel and a method of forming the same according to an embodiment of the present invention.
Figure 2:
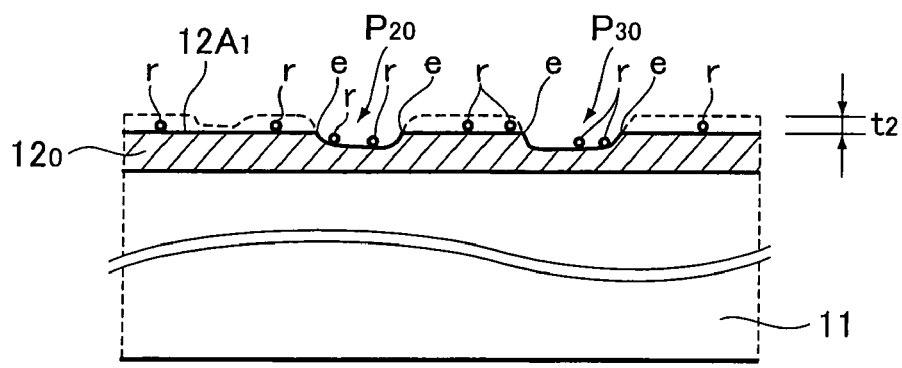
Figure 2:
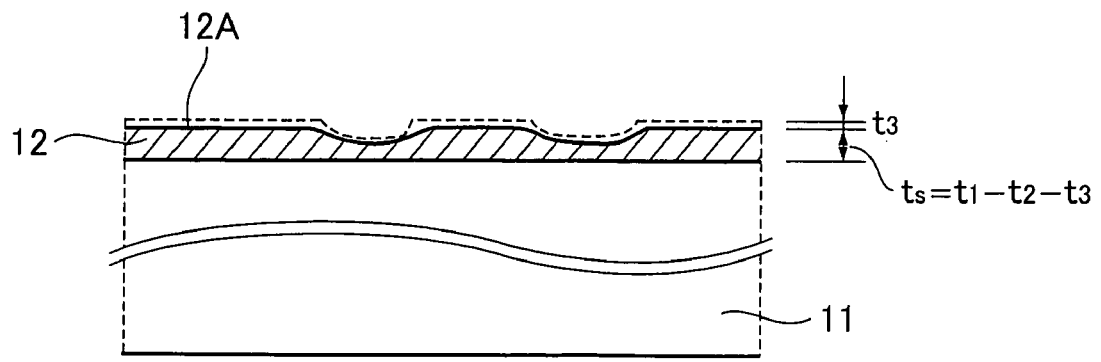

Hereinafter, embodiments of the present invention will be described with reference to the drawings. FIGS. 2A to 2C are explanatory diagrams for explaining the organic EL panel and the method of forming the same according to an embodiment of the present invention. According to the organic EL panel and the method of forming the same of the present invention, an organic EL device comprising a bottom electrode 12, organic layers 20 including at least an organic luminescent layer, and a top electrode 14, is formed on a substrate 11 as in the conventional technique shown in FIG. 1. The display area is formed with this organic EL device as a display unit. Thus, the same reference numerals as in FIG. 1 will also be employed in the following description of the embodiment of the present invention.

As shown in FIGS. 2A to 2C, the organic EL panel according to the present embodiment is characterized in that the bottom electrode 12 has an etched surface 12A, and the organic layers (not shown) for constituting the organic EL device are formed on this etched surface 12A. Here, the etched surface 12A is formed by chemically etching a polished surface $12A_1$ of an electrode material film $12_0$ made of an electrode material such as ITO.

The organic EL panel according to the embodiment of the present invention is also characterized in that the bottom electrode 12 has a set thickness ts given by ts=t1−t2−t3 Here, t1 is the thickness in which the electrode material film $12_0$ is formed, t2 is a set thickness by which the surface of the electrode material film $12_0$ is polished (here, t2<t1), and t3 is a thickness adjustment to be made in the chemical etching.

Another characteristic lies in that the foregoing etched surface 12A is formed at a low etching rate which is achieved by a dilute etchant, for example. Another characteristic lies in that the set thickness ts is determined in accordance with the chromaticity of the organic EL device to be formed thereon. The low etching rate employed herein can be achieved by various techniques. The possible techniques include: (1) using a dilute etchant; (2) reducing the time of the etching step; (3) reducing the amount of the etchant to be issued in the system which performs the etching step; (4) lowering the operating temperature in the etching step; and (5) using the techniques (1) to (4) in combination. In the embodiment of the present invention, it is preferable to select appropriate techniques depending on the organic EL device to be formed.

Now, the method of forming such an organic EL panel according to the embodiment of the present invention will be described with reference to FIGS. 2A to 2C. Initially, as shown in FIG. 2A, the electrode material film $12_0$ is formed on the substrate 11 to a set thickness of t1. Here, if typical deposition technologies such as sputtering deposition and electron beam (EB) deposition are used, not a few pits and projections (including pits $P_1$, $P_2$, and $P_3$) are formed in/on the surface of the electrode material film $12_0$ due to various factors.

Subsequently, as shown in FIG. 2B, the electrode material film $12_0$ is polished by such techniques as polishing, lapping, and tape lapping, to form the polished surface $12A_1$. Depending on the polishing thickness, pits $P_{20}$ and $P_{30}$ may still remain here. The pits form sharp edges e at their ends. In addition, abrasives r sometimes remain on the polished surface $12A_1$. If the organic layers are laminated on the polished surface $12A_1$ in this state to form the organic EL device, the edges e and the residual abrasives r mentioned above may cause the occurrence of leak currents.

Then, after the formation of the polished surface $12A_1$, this polished surface $12A_1$ is chemically etched into the etched surface 12A as shown in FIG. 2C. This can remove the edges e and the residual abrasives r mentioned above, thereby forming a smooth surface. Turning now to the adjustment of the set thickness ts of the bottom electrode 12, the bottom electrode 12 is adjusted to a desired set thickness ts which is determined, for example, in accordance with the chromaticity of the organic EL device to be formed on the bottom electrode 12. The adjustment is effected by adjusting the thickness t2 by which the surface of the electrode material film $12_0$ is polished and the thickness t3 by which the polished surface $12A_1$ is chemically etched.

FIGS. 3A to 3D are explanatory diagrams for explaining the organic EL panel and the method of forming the same according to another embodiment of the present invention. This embodiment differs from the foregoing embodiment in that the electrode material film $12_0$ of the bottom electrode 12 is formed on the substrate 11 in a plurality of divided processes (a first electrode material film $12_{01}$ in a thickness of t11, and a second electrode material film $12_{02}$ in a thickness of t12). The present embodiment is otherwise the same as the foregoing (the same reference numerals will be given to omit redundant description).

One of the characteristics of the organic EL panel and the method of forming the same according to such an embodiment consists in the utilization of the following fact. That is, in typical deposition methods such as sputtering, thicker films deteriorate in surface roughness since the pits and projections at the surface grow with the thickness, whereas thinner films are relatively low in surface roughness. Then, the bottom electrode 12 is deposited in a plurality of divided processes, thereby avoiding deterioration in surface roughness.

Figure 3A:
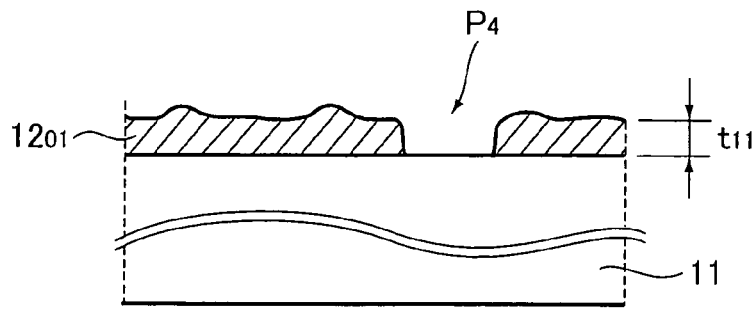
FIGS. 3A to 3D are explanatory diagrams for explaining an organic EL panel and a method of forming the same according to another embodiment of the present invention.
Figure 3B:
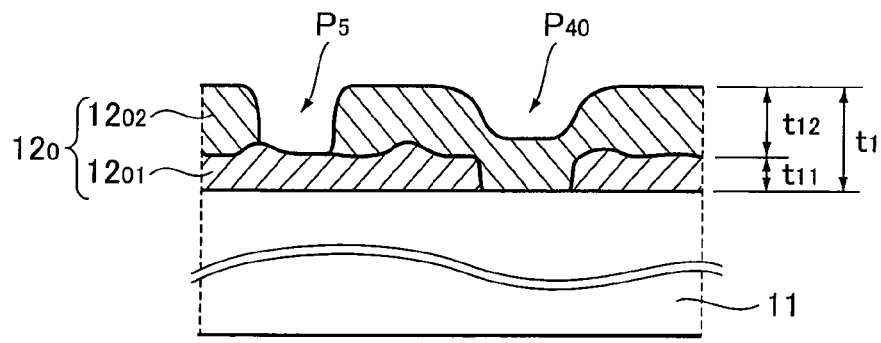

Moreover, if the bottom electrode 12 is deposited in a single process, such a deposition defect (a location where deposition is missing completely because of an adhering dust or the like) $P_4$ as shown in FIG. 3A can sometimes occur. If the deposition is continued in this state, a deep deposition defect will be formed in that location. Now, suppose that the deposition is performed in a plurality of divided processes, and a deposition defect $P_5$ occurs at the second deposition as shown in FIG. 3B. Even in this case, it seem unlikely that the deposition defect $P_4$ resulting from the first deposition and a deposition defect $P_5$ resulting from the second deposition fall on the same location (overlap with each other) The plurality of times of deposition can thus create the situation that at least the part lying below the thickness t11 of the first deposition is free from pits ascribable to deposition defects.

Then, the electrode material film $12_0$ ($12_{01}$, $12_{02}$) formed thus is polished and chemically etched until the pits disappear. This makes it possible to obtain the bottom electrode 12 having the etched surface 12A which has a flat surface and from which the residual abrasives r are removed.

Moreover, the etched surface 12A can be formed totally flat without any pit if t2, the thickness by which the electrode material film $12_0$ ($12_{01}$, $12_{02}$) is polished (see FIG. 3C), and t3, the thickness by which the polished surface $12A_1$ is etched chemically (see FIG. 3D), fall within the range of t12<(t2+t3)<(t11+t12). Then, t2 and t3 can be adjusted within the range mentioned above, so that the bottom electrode 12 is adjusted to a desired thickness ts while ensuring the flat etched surface 12A.

Figure 3C:
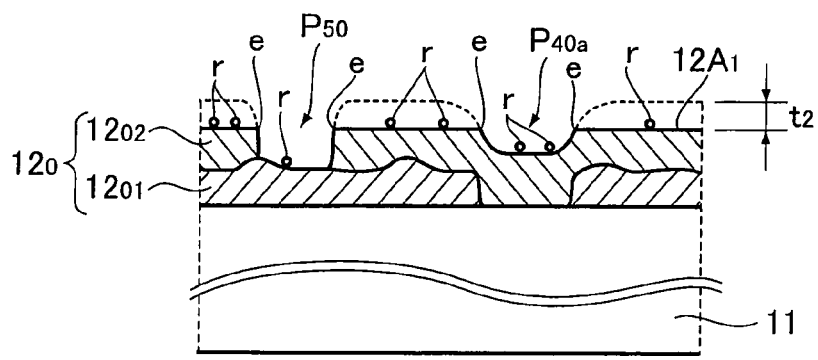
Figure 3D:
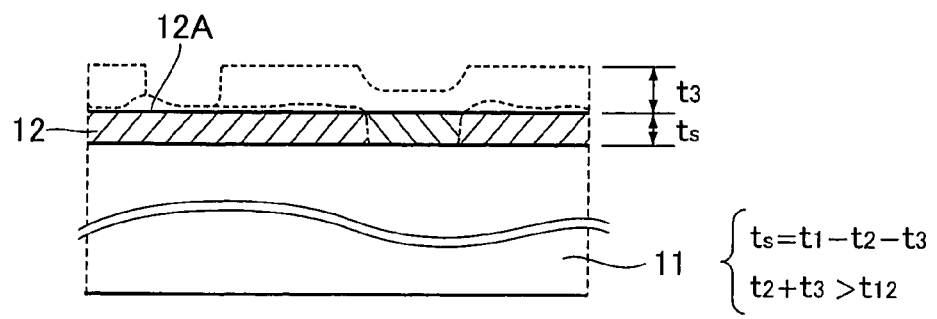

More specifically, the bottom electrode 12 according to this embodiment is formed by the following steps. Initially, as shown in FIG. 3A, the first deposition is performed to obtain the electrode material film $12_{01}$ having a thickness t11 which is greater than the set thickness ts of the bottom electrode 12. As shown in FIG. 3B, the second and subsequent depositions are performed to a thickness of t12 which is greater than the thickness t11 of the electrode material film $12_{01}$ formed by the first deposition. This forms the electrode material film $12_0$ ($12_{01}$, $12_{02}$). Then, as shown in FIG. 3C, the electrode material film $12_0$ is polished and chemically etched by the thickness t3 which is greater than the thickness t12 of the electrode material film $12_{02}$. Here, the bottom electrode 12 having the flat etched surface 12A can be formed in the desired thickness ts by adjusting the polishing and etching thicknesses (t2+t3) as appropriate within the range mentioned above. Incidentally, the thickness adjustment here can be effected by adjusting the processing times of the respective depositions, or the polishing and the etching.

Figure 4:
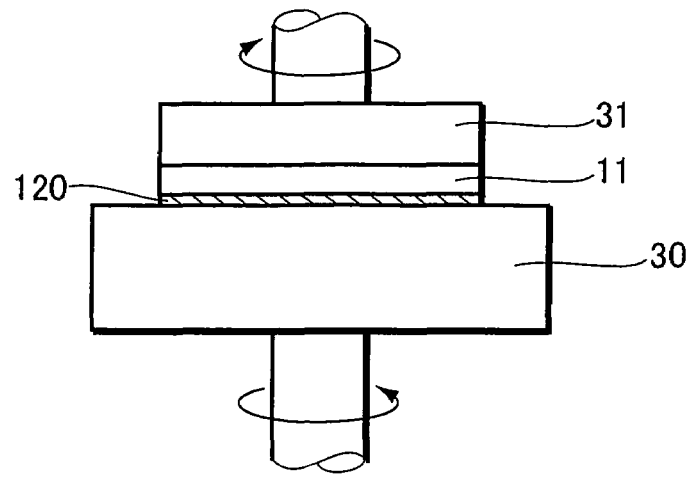
FIG. 4 is an explanatory diagram for explaining a surface polishing process.

Now, the surface polishing process and the chemical etching process mentioned above will be described in more detail. The surface polishing process may use a known polishing method (or polishing system) such as shown in FIG. 4. Here, the substrate 11 having the electrode material film $12_0$ formed thereon is supported by a substrate carrier 31 from a side opposite to the side on which the electrode material film $12_0$ is formed. A polishing member 30 is pressed against the electrode material film $12_0$ on the supported substrate 11. In this state, the substrate carrier 31 and the polishing member 30 are rotated in opposite directions, thereby polishing the surface of the electrode material film $12_0$. Si or other abrasives can be put between the surface to be polished and the polishing member 30 for efficient polishing. In general, abrasives having a size of several tens of nanometers are used in forming the bottom electrode having a thickness of 100 to 150 nm (a width of several tens to several hundreds of micrometers). The polishing method is not limited thereto, but may use other known techniques.

For the chemical etching process, so-called wet etching is performed by using an etchant. Since this chemical etching process includes a high-precision thickness adjustment to the bottom electrode, a certain low etching rate (nm/min) is preferred. This low etching rate can be achieved by using a dilute etchant.

Figure 5:
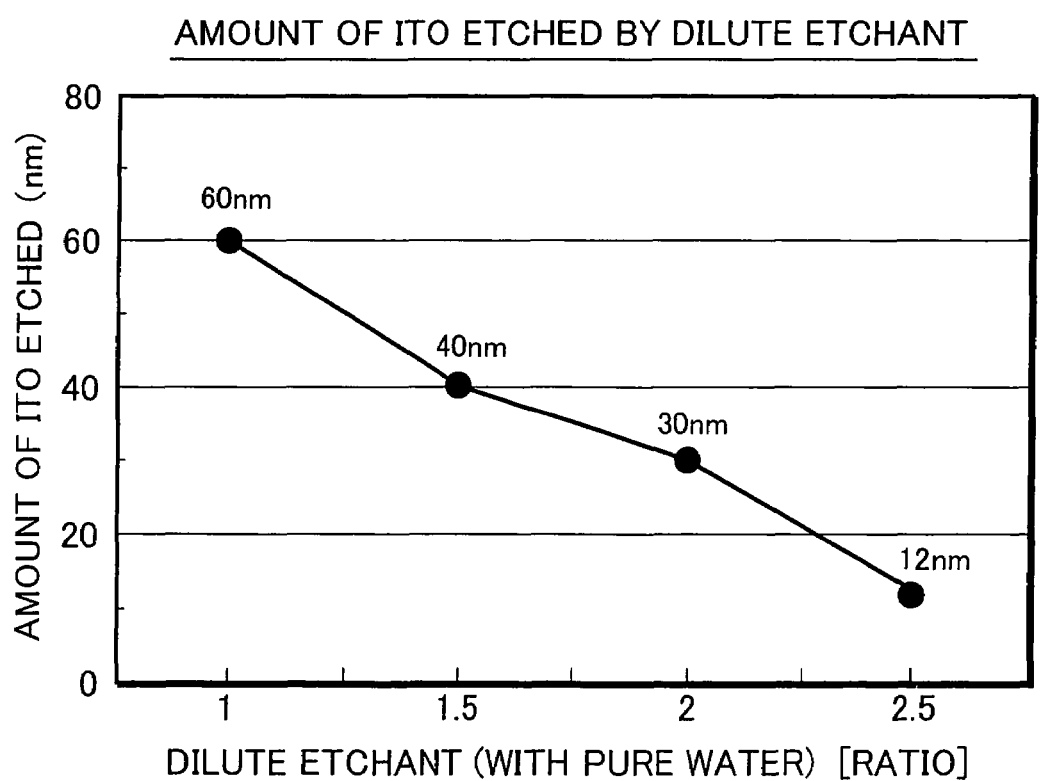
FIG. 5 is a graph showing the amounts of ITO etched by dilute etchants.

FIG. 5 shows test results on the etching rates of dilute etchants. The etching rates shown here are for situations where ITO thin films are used as test pieces, and an etchant containing iron chloride $FeCl_3$+hydrochloric acid HCl at a ratio of 2:1 is diluted with pure water. The plots show the amounts of etching (in a processing time of 1 min) using etchants which are diluted with pure water in different ratios [1, 1.5, 2, and 2.5]. As shown in the graph, the dilution ratio can be increased to suppress the etching rate lower. For appropriate thickness adjustment, the etchant of this test example (a mixed solution of iron chloride $FeCl_3$:hydrochloric acid HCl=2:1) is used with pure water at a dilution ratio of 1.5 (preferably, 2) or higher. This provides a low etching rate of 40 nm/min (preferably, 30 nm/min) or less.

Incidentally, the means for achieving the low etching rate is not limited to the use of the dilute etchant mentioned above. For example, the low etching rate may be achieved by such means as using an etchant which has a low etching rate characteristic in the first place, and lowering the etching temperature.

Hereinafter, the individual components of the organic EL panel according to the embodiment of the present invention will be described in more detail (for reference numerals, see FIG. 1).

a. Substrate:

The substrate 11 of the organic EL panel may be shaped like a flat plate, a film, a spherical surface, or the like, and is not limited to any particular form. Such materials as glass, plastic, quartz, and metal may be used. In the method of outputting light from the side of the substrate 11 (bottom emission method), it is preferable to use a plate-shaped or film-shaped transparent substrate made of such materials as glass and plastic.

b. Electrodes:

Either one of the bottom electrode 12 and the top electrodes 14 is used as an anode, and the other as a cathode. The anode is made of a material having a work function higher than that of the cathode. The anode is made of a transparent conductive film such as metal films including chromium (Cr), molybdenum (Mo), nickel (Ni), and platinum (Pt), and metal oxide films including ITO and IZO. On the other hand, the cathode is made of a material having a work function lower than that of the anode. Metal films such as aluminum (Al) and magnesium (Mg), amorphous semiconductors such as doped polyaniline and doped polyphenylenevinylene, and oxides such as $Cr_2O_3$, NiO, and $Mn_2O_5$ may be used. When both the bottom electrode 12 and the top electrode 14 are made of transparent materials, a reflecting film may be arranged on the electrode opposite from the light-emitting side.

c. Organic Layers:

For the organic layers 20, a single or a plurality of organic compound material layers including at least an organic luminescent layer is/are formed. The layer configuration is not limited in particular. In general, as shown in FIG. 1, a laminate of the hole transporting layer 21, the luminescent layer 22, and the electron transporting layer 23 in order from the anode side to the cathode side may be used. Any of the luminescent layer 22, the hole transporting layer 21, and the electron transporting layer 23 may be laminated in numbers, not a single layer alone. Either one or both of the hole transporting layer 21 and the electron transporting layer 23 may be omitted. Depending on the application, such organic material layers as a hole injection layer and an electron injection layer may be inserted. The hole transporting layer 21, the luminescent layer 22, and the electron transporting layer 23 may be made of materials selected as appropriate from ones used heretofore (regardless of polymeric materials or low molecular weight materials).

Moreover, the luminescent material for forming the luminescent layer 22 may be either of materials which emits luminescence (fluorescence) when returning from a singlet excited state to a ground state and which emits luminescence (phosphorescence) when returning from a triplet excited state to a ground state.

d. Sealing Member, Sealing Film:

The organic EL panel according to the embodiment of the present invention includes one in which the organic EL device 10 is sealed with a sealing member made of metal, glass, plastic, or the like, and one in which the organic EL device 10 is sealed with a sealing film.

Available sealing members include sealing substrates made of glass in which sealing recesses (regardless of single grooves or double grooves) are formed by such processes as press molding, etching, and blasting. A glass plate having a substrate and a sealing space formed thereon by using glass (or plastic) spacers may also be used.

The sealing film may be made of a single layer of protection film or a lamination of a plurality of protection films. Both inorganic and organic materials may be used. The inorganic materials include nitrides such as SiN, AlN, and GaN, oxides such as SiO, $Al_2O_3$, $Ta_2O_5$, ZnO, and GeO, oxynitrides such as SiON, carbonitrides such as SiCN, metal fluoride compounds, and metal films. The organic materials include epoxy resin, acryl resin, fluoric polymers such as polyparaxylene, perfluoroolefin, and perfluoroether, metal alkoxides such as $CH_3OM$ and $C_2H_5OM$, polyimide precursors, and perylene compounds. The lamination and materials are selected as appropriate depending on the design of the organic EL device.

e. Panel Modes:

The organic EL panel according to the embodiment of the present invention may be a display panel of passive matrix type or a display panel of active matrix type. Both monochrome and multicolor displays are applicable. To form a color display panel, a full-color organic EL panel or multicolor organic EL panel may be formed by using such methods as a separate deposition method, a color filter (CF) method, and a color changing material (CCM) method. In the CF and CCM methods, white or blue monochromatic organic EL devices are combined with color filters or color conversion layers made of fluorescence materials. Moreover, the organic EL panel according to the embodiment of the present invention may be of bottom emission method in which the light is output from the side of the substrate 11 as described above, or of top emission method in which the light is output from the side opposite from the substrate 11.

Now, a specific example of the method of forming the organic EL panel according to the embodiment of the present invention will be described below (for reference numerals, see FIG. 1).

[Substrate Processing Step]

When a glass substrate is employed, the processing varies with the type of the glass (blue sheet or white sheet). In the case of using the blue sheet (a glass substrate made of soda lime glass, borosilicate glass, low alkali glass, or the like), a coating layer such as $SiO_2$ is formed on the substrate surface. The purpose of the coating layer is to prevent the alkali components contained in the substrate, such as sodium and potassium, from being eluted to affect the adhesive strength of the organic EL device or the sealing member. In the case of using the expensive white sheet (a glass substrate made of no-alkali glass, quartz glass, or the like), the formation of the coating layer mentioned above is typically omitted because of the absence of impurity deposition. A single or a plurality of $SiO_2$ films may also be formed and then polished at the surface, even with the purpose of flattening pits and projections at the substrate surface.

Specifically, the glass substrate is immersed into an $SiO_2$-containing coating solution stored in a dipping bath. Then, the resultant is gradually pulled out of the dipping bath to hydrolyze the layer of the coating solution on the surface of the glass substrate, followed by drying and baking processes. As a result, an $SiO_2$ film of 50 to 200 nm (preferably 80 nm) is formed. Next, in a polisher using abrasives of alumina, diamond powder, or the like, the substrate 11 is polished at the surface to a thickness of 20 to 100 nm, thereby forming the polished surface.

[Bottom Electrode Deposition Step, Surface Polishing Step]

Next, the material of the bottom electrode, such as ITO, is deposited on the surface of the substrate 11 by sputtering or other methods, thereby forming the electrode material film $12_0$. As described previously, the electrode material may be deposited a plurality of times to fill in pinholes and other pits occurring during the deposition. After the deposition, the surface is polished by polishing, lapping, tape lapping, or the like as described above. The polishing may use publicly-known methods as mentioned previously. Here, the deposition time and the polishing time are adjusted to obtain the set thickness.

[Chemical Etching Step on Bottom Electrode Surface, Patterning Step]

The etchant, or the mixed solution of the iron chloride aqueous solution and hydrochloric acid ($FeCl_3$:HCl=2:1), is diluted with pure water to 1.5 to 3.5 parts (preferably 2.0 to 2.5 parts). The substrate 11 having the electrode material film $12_0$ formed thereon is wet etched by using this dilute etchant, whereby the electrode material film $12_0$ is etched for a predetermined time. The time of this etching process is controlled to adjust the final thickness of the bottom electrode 12. For example, the ITO film is adjusted to a thickness of 110 nm to 170 nm.

Subsequently, a photoresist is formed on the ITO film in an electrode pattern (such as in stripes). The ITO film is patterned into the desired electrode pattern by photolithography using the foregoing etchant (the undiluted, concentrate solution).

In addition, the substrate 11 having the patterned bottom electrode 12 is coated with an insulating film having a predetermined thickness, made of insulating material such as polyimide, by spin coating or the like. Then, the insulating film is patterned by photolithography or other patterning methods, so that insulated and sectioned unit luminescent areas are formed on the bottom electrode 12. While the foregoing example has dealt with the case where the chemical etching step is followed by the pattering step, the patterning step may be followed by the chemical etching step. The patterning step may be performed before the polishing step.

[Organic Layer Deposition Step, Top Electrode Forming Step, Sealing Step]

Each of the organic layers 20 described above is deposited by an application method such as spin coating and dipping, a wet process such as screen printing and inkjet printing, or a dry process such as vapor deposition and laser transfer. For example, the material layers of the hole transporting layer 21, the luminescent layer 22, and the electron transporting layer 23 are laminated in succession by vacuum deposition.

Here, the luminescent layer is formed by using deposition masks so that the luminescent layer is deposited in separate sections according to the plurality of luminescence colors. For the separate deposition, organic materials or combinations of a plurality of organic materials for emitting luminescence in three colors, or RGB, are deposited in the unit luminescent areas corresponding to R, G, and B, respectively. For each of the unit luminescent areas, the same material may be deposited twice or more so as to preclude undeposited locations in the unit luminescent area.

More specifically, the materials deposited on the ITO film (bottom electrode 12), or the anode, are as follows: 30 nm of copper phthalocanine as the hole injection layer; 60 nm of α-NPD as the hole transporting layer; 30 nm of $Alq_3$ as the luminescent layer and the electron transporting layer; 1 nm of LiF as the electron injection layer; and 100 nm of Al as the top electrode, or cathode.

Subsequently, a sealing recess is formed in a sealing substrate of glass by such processes as press molding, etching, and blasting in an $N_2$ atmosphere. A drying agent such as BaO is pasted to the sealing recess. The sealing substrate is then joined and sealed by an adhesive such as photo-curing resin, thereby obtaining the organic EL panel.

According to the organic EL panel and the method of forming the same of such an embodiment, the surface of the bottom electrode is flattened so that the organic layers deposited hereon have uniform thicknesses. This makes it possible to avoid the occurrence of leak currents, thereby allowing favorable luminescence characteristics. In particular, after the surface polishing of the bottom electrode, sharp edges and residual abrasives can be removed effectively by chemical etching, so that the causes of leaks are eliminated. In addition, since it is possible to flatten the surface of the bottom electrode while exercising thickness control to a desired thickness, the peak wavelengths of the spectrum of the output light can be tailored to the luminescence colors. It is therefore possible to improve the efficiency of the output light.

While there has been described what are at present considered to be preferred embodiments of the present invention, it will be understood that various modifications may be made thereto, and it is intended that the appended claims cover all such modifications as fall within the true spirit and scope of the invention.

What is claimed is:

1. A method of forming at least one organic EL panel having an organic EL device formed on a substrate, the device comprising a bottom electrode, an organic layer including at least an organic luminescent layer, and a top electrode, the method comprising the steps of:
    forming an electrode material film having a set thickness on the substrate;
    polishing the electrode material film to form a polished surface; and
    after the formation of the polished surface, chemically etching the polished surface at a rate of 40 nm/min or less to form the bottom electrode having a desired thickness.

2. The method of forming an organic EL panel according to claim 1, wherein the chemical etching step is achieved by using a dilute etchant.

3. The method of forming an organic EL panel according to claim 1, wherein the bottom electrode is adjusted to a desired thickness by adjusting a thickness by which the surface of the electrode material film is polished and a thickness by which the polished surface is chemically etched.

4. The method of forming an organic EL panel according to claim 3, wherein the thickness of the bottom electrode is adjusted in accordance with a chromaticity of the organic EL device.

5. The method of forming an organic EL panel according to claim 1, wherein the electrode material film is formed in a plurality of divided processes.

* * * * *